United States Patent
Menon et al.

(10) Patent No.: US 11,177,227 B2
(45) Date of Patent: Nov. 16, 2021

(54) METHOD AND APPARATUS FOR HEAT SINKING HIGH FREQUENCY IC WITH ABSORBING MATERIAL

(71) Applicant: Anokiwave, Inc., San Diego, CA (US)

(72) Inventors: Gaurav Menon, San Marcos, CA (US); Jonathan P. Comeau, San Diego, CA (US); Nitin Jain, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 23 days.

(21) Appl. No.: 16/886,370

(22) Filed: May 28, 2020

(65) Prior Publication Data
US 2020/0294942 A1    Sep. 17, 2020

Related U.S. Application Data

(62) Division of application No. 16/153,528, filed on Oct. 5, 2018, now Pat. No. 10,763,226.
(Continued)

(51) Int. Cl.
| | |
|---|---|
| *H01L 23/66* | (2006.01) |
| *H01Q 3/26* | (2006.01) |
| *H01Q 1/02* | (2006.01) |
| *H01L 23/552* | (2006.01) |
| *H01Q 17/00* | (2006.01) |
| *H01Q 21/06* | (2006.01) |

(Continued)

(52) U.S. Cl.
CPC ............ *H01L 23/66* (2013.01); *H01L 23/552* (2013.01); *H01Q 1/02* (2013.01); *H01Q 1/40* (2013.01); *H01Q 3/2658* (2013.01); *H01Q 3/40* (2013.01); *H01Q 15/24* (2013.01); *H01Q 17/00* (2013.01); *H01Q 21/065* (2013.01); *H01L 23/367* (2013.01); *H01L 23/42* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2223/6677* (2013.01); *H01L 2224/0401* (2013.01); *H01L 2224/04042* (2013.01); *H01L 2224/11332* (2013.01); *H01L 2224/131* (2013.01); *H01L 2224/16227* (2013.01); *H01L 2224/32225* (2013.01); *H01L 2224/48227* (2013.01); *H01L 2224/73204* (2013.01); *H01L 2224/73253* (2013.01); *H01L 2224/81815* (2013.01); *H01L 2224/92125* (2013.01); *H01L 2224/92225* (2013.01); *H01L 2924/14* (2013.01); *H01L 2924/1421* (2013.01); *H01L 2924/3025* (2013.01)

(58) Field of Classification Search
CPC ............ H01L 23/66; H01Q 17/00–008; H01Q 21/065; H01Q 3/2658
See application file for complete search history.

*Primary Examiner* — Amar Movva
(74) *Attorney, Agent, or Firm* — Nutter McClennen & Fish LLP

(57) ABSTRACT

A phased array has a laminar substrate, a plurality of elements on the laminar substrate forming a patch phased array, and integrated circuits on the laminar substrate. Each integrated circuit is a high frequency integrated circuit configured to control receipt and/or transmission of signals by the plurality of elements in the patch phased array. In addition, each integrated circuit has a substrate side coupled with the laminar substrate, and a back side. The phased array also has a plurality of heat sinks. Each integrated circuit is coupled with at least one of the heat sinks. At least one of the integrated circuits has a thermal interface material in conductive thermal contact with its back side. The thermal interface material thus is between the at least one integrated circuit and one of the heat sinks. Preferably, the thermal interface material has a magnetic loss tangent value of between 0.5 and 4.5.

20 Claims, 6 Drawing Sheets

Related U.S. Application Data

(60) Provisional application No. 62/568,611, filed on Oct. 5, 2017.

(51) Int. Cl.
*H01Q 1/40* (2006.01)
*H01Q 15/24* (2006.01)
*H01Q 3/40* (2006.01)
*H01L 23/00* (2006.01)
*H01L 23/42* (2006.01)
*H01L 23/367* (2006.01)

METHOD AND APPARATUS FOR HEAT SINKING HIGH FREQUENCY IC WITH ABSORBING MATERIAL

PRIORITY

This patent application is a divisional patent application of U.S. patent application Ser. No. 16/153,528, filed Oct. 5, 2018, entitled, "METHOD AND APPARATUS FOR HEAT SINKING HIGH FREQUENCY IC WITH ABSORBING MATERIAL," which claims priority from provisional U.S. Patent Application No. 62/568,611, filed Oct. 5, 2017 entitled, "METHOD AND APPARATUS FOR HEAT SINKING HIGH FREQUENCY IC WITH ABSORBING MATERIAL," the disclosures of which are both incorporated herein, in their entireties, by reference.

FIELD OF THE INVENTION

Illustrative embodiments of invention generally relate to high-frequency phased array systems and, more particularly, illustrative embodiments relate to managing the thermal profile of a high-frequency integrated circuit in a phased array system.

BACKGROUND OF THE INVENTION

Antennas that emit electronically steered beams are known in the art as "phased array antennas." Such antennas are used worldwide in a wide variety of commercial and radar applications. They typically are produced from many small radiating elements that are individually phase controlled by high-frequency integrated circuits to form a beam in the far field of the antenna.

In a manner similar to other devices, integrated circuits that use high frequency signals (e.g., 10 GHz and larger) generally require heat sinks to manage their thermal profile. Undesirably, heat sinks can cause other problems that interfere with accurate formation of the beam.

SUMMARY OF VARIOUS EMBODIMENTS

In accordance with one embodiment of the invention, a phased array has a laminar substrate, a plurality of elements on the laminar substrate forming a patch phased array, and a plurality of integrated circuits on the laminar substrate. Each integrated circuit is a high frequency integrated circuit (operating at mm-wave frequencies, such as between 10 GHz and 90 GHz or more) configured to control receipt and/or transmission of signals by the plurality of elements in the patch phased array. In addition, each integrated circuit has a substrate side coupled with the laminar substrate, and a back side. The phased array also has a plurality of heat sinks.

Each integrated circuit is coupled with at least one of the heat sinks. At least one of the integrated circuits has a thermal interface material in conductive thermal contact with its back side. The thermal interface material thus is between the at least one integrated circuit and one of the heat sinks. Preferably, the thermal interface material has a magnetic loss tangent value of between 0.5 and 4.5, although other ranges may suffice. The thermal interface material thus a prescribed magnetic loss tangent value sufficient to at least provide partial RF or EM shielding (e.g., attenuating one or both of those interfering signals a prescribed amount, such as at least any of 10%, 20%, 50%, 80%, 90%, 95%), or some attenuation between those values.

The thermal interface material may include a variety of materials, such as carbon and/or have a magnetic loss tangent value of between 0.5 and 4.5 (e.g., between 1.0 and 4.0). The phased array also may have a plurality of transmission lines on the laminar substrate. To ensure communication, each integrated circuit physically couples with the one corresponding element by at least one of the plurality of transmission lines.

The plurality of patches may form any of a variety of lattice structures, such as a triangular lattice. Moreover, the at least one integrated circuit, thermal interface material, and the one heat sink may be in conductive thermal contact.

In accordance with another embodiment, a method of forming a phased array couples a plurality of integrated circuits to a laminar substrate having a patch array formed by a plurality of elements. Each integrated circuit is configured to control receipt and/or transmission of signals by the plurality of elements in the patch array, and is a high frequency integrated circuit operating at frequencies of between 10 GHz and 20 GHz. The method also provides thermal interface material having a magnetic loss tangent value of between 0.5 and 4.5, and couples a plurality of heat sinks to the plurality of integrated circuits. At least one of the integrated circuits is in conductive thermal contact with the thermal interface material and one of the heat sinks ("given heat sink(s)"). In preferred embodiments, the thermal interface material is between at least one integrated circuit and the given heat sink(s).

In accordance with another embodiment of the invention, an integrated circuit system has a die with first and second sides, and contains high frequency circuitry operating at frequencies of between 10 GHz and 20 GHz. The system also has a plurality of interfaces (on the first side) in electrical communication with the high frequency circuitry, and thermal interface material in conductive thermal contact with the second side of the die. The thermal interface material has a magnetic loss tangent value of between 0.5 and 4.5. To further manage thermal performance, the system also has a heat sink in conductive contact with the die. The thermal interface material is between second side of the die and the heat sink.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, an AESA system manages its thermal performance while mitigating potential cross-talk/interference caused by heat sinks used to dissipate heat. To that end, the AESA system has a thermal interface material between the heat sink and one or more of the integrated circuits being cooled. To mitigate electromagnetic interference ("EMI"), the thermal interface material preferably has properties that reduces/mitigates the potential electromagnetic fields from penetrating through it. Accordingly, the thermal interface material effectively forms an electromagnetic barrier between the heat sink and the integrated circuit. Details of illustrative embodiments are discussed below.

Figure 1:
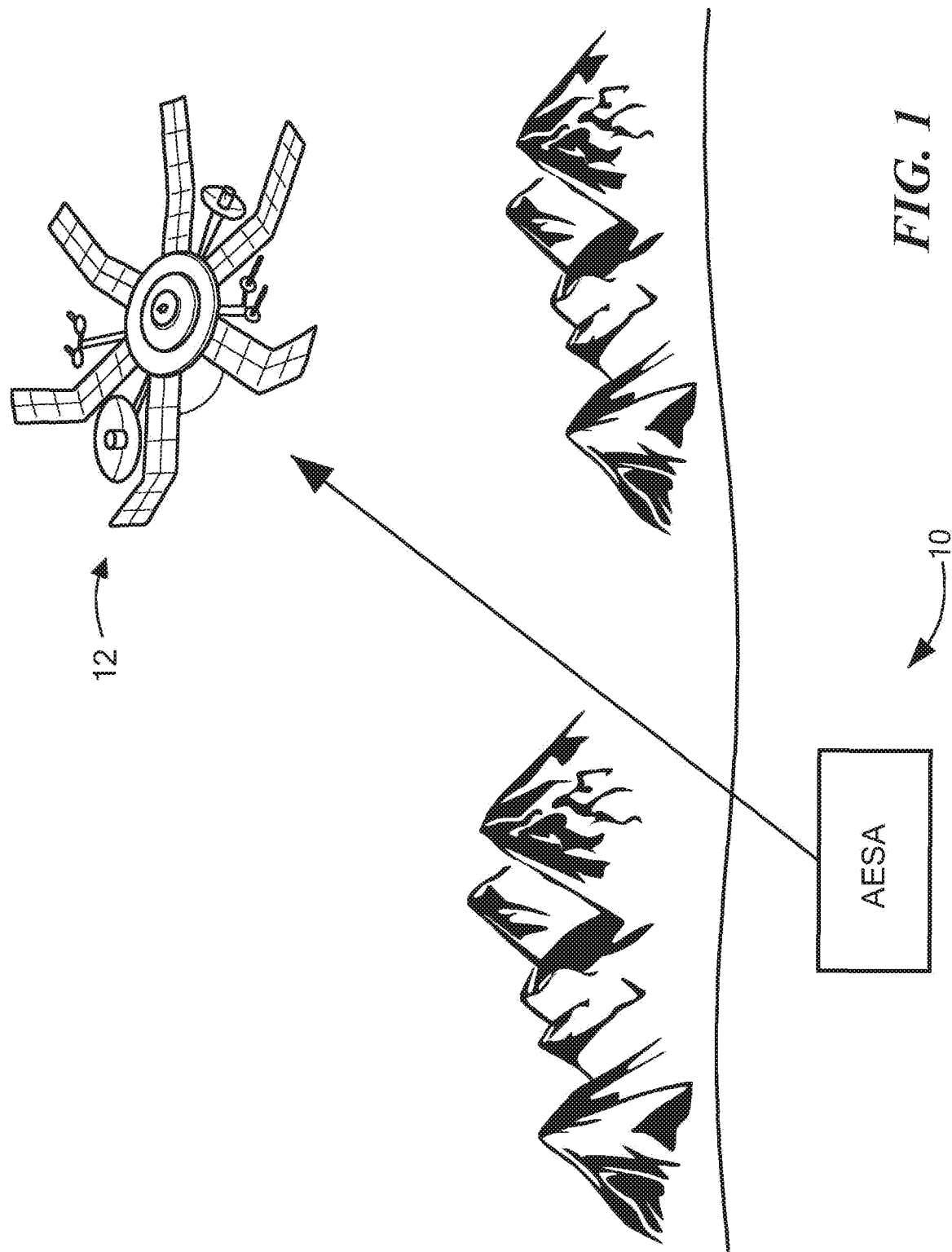
FIG. 1 schematically shows an active electronically steered antenna system ("AESA system") configured in accordance with illustrative embodiments of the invention and communicating with a satellite.

FIG. 1 schematically shows an active electronically steered antenna system ("AESA system 10") configured in accordance with illustrative embodiments of the invention and communicating with an orbiting satellite 12. A phased array (discussed below and identified by reference number "10A") implements the primary functionality of the AESA system 10. Specifically, as known by those skilled in the art, the phased array 10A forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G, or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 2A:
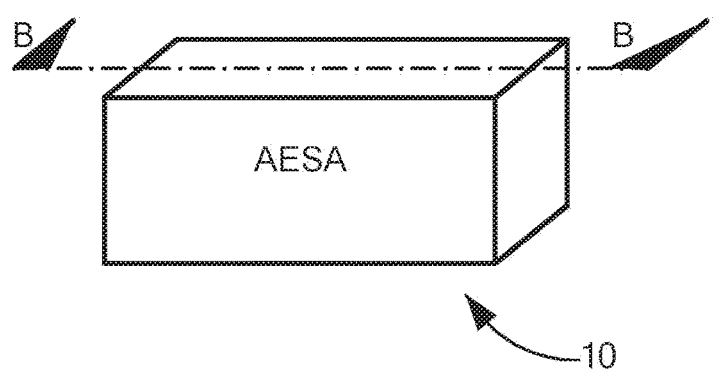
FIGS. 2A and 2B schematically show generalized diagrams of an AESA system that may be configured in accordance with illustrative embodiments of the invention.
Figure 2B:
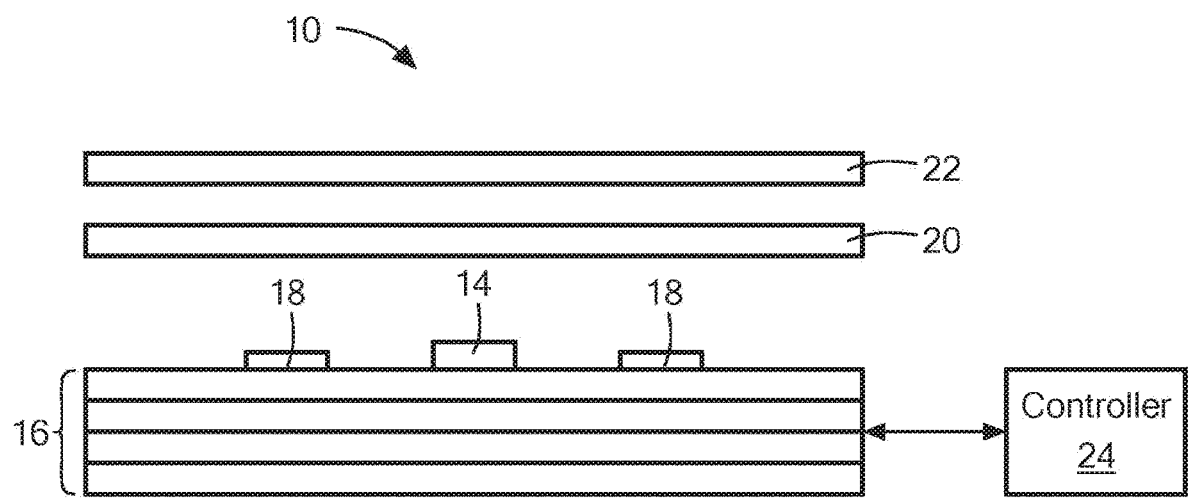

FIGS. 2A and 2B schematically show generalized diagrams of the AESA system 10 configured in accordance with illustrative embodiments of the invention. Specifically, FIG. 2A schematically shows a block diagram of the AESA system 10, while FIG. 2B schematically shows a cross-sectional view of a small portion of the same AESA system 10 across line B-B. This latter view shows a single silicon integrated circuit 14 mounted onto a substrate 16 between two transmit and/or receive elements 18, i.e., on the same side of a supporting substrate 16 and juxtaposed with the two elements 18. In alternative embodiments, however, the integrated circuit 14 could be on the other side/surface of the substrate 16. The integrated circuit 14 preferably includes circuitry that can operate at high frequencies, such as at 10 GHz and higher (e.g., 10 GHz to 20 GHz).

The phased array 10A also has a polarizer 20 to selectively filter signals to and from the phased array 10A, and a radome 22 to environmentally protect the phased array 10A.

A separate antenna controller 24 (FIG. 2B) electrically connects with the phased array 10A to calculate beam steering vectors for the overall phased array 10A, and to provide other control functions.

Figure 3A:
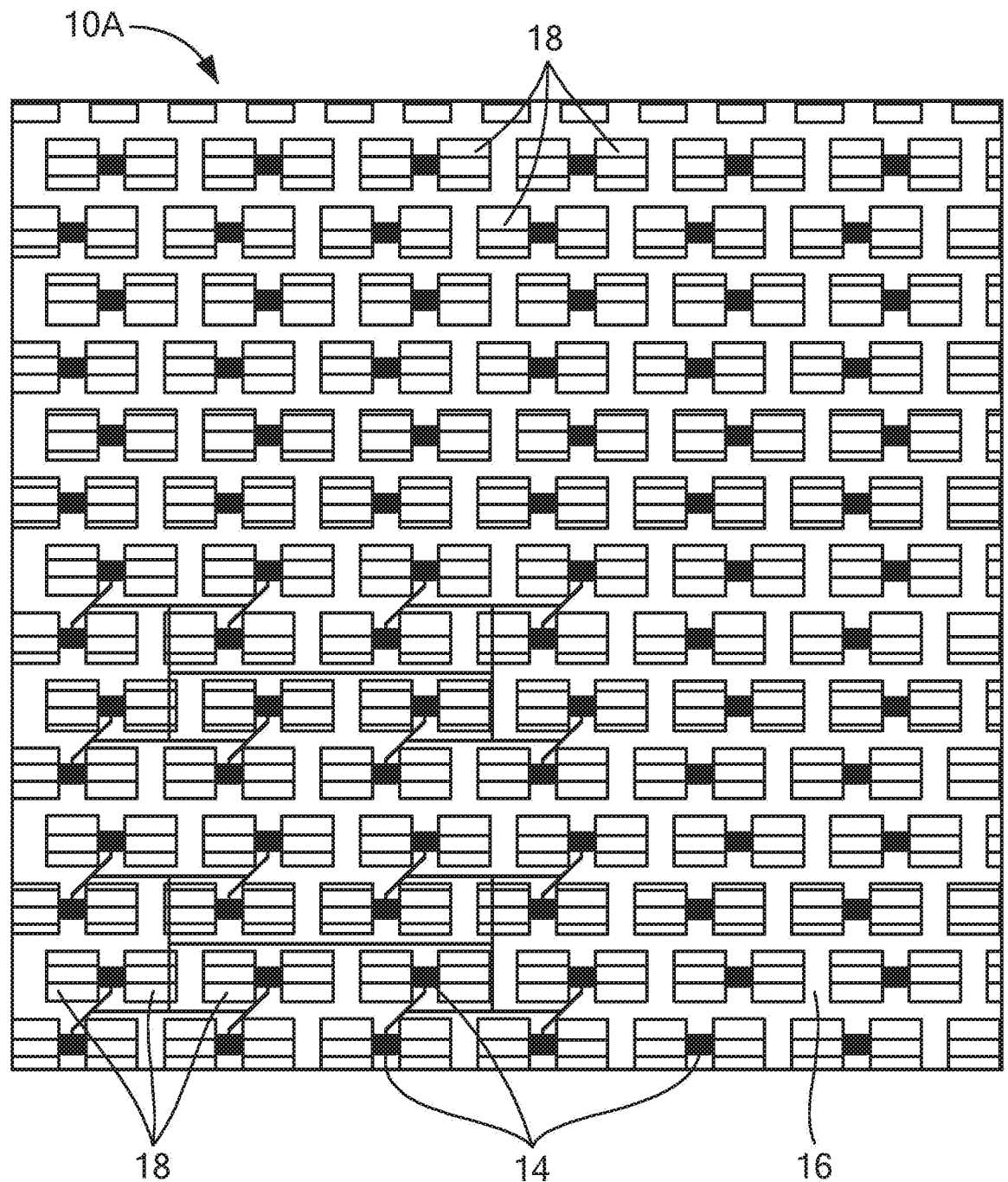
FIG. 3A schematically shows a plan view of a laminar printed circuit board portion of an AESA configured in accordance with illustrative embodiments of the invention.

FIG. 3A schematically shows a plan view of a primary portion of an AESA system 10 that may be configured in accordance with illustrative embodiments of the invention. In a similar manner, FIG. 3B schematically shows a close-up of a portion of the phased array 10A of FIG. 3A.

Specifically, the AESA system 10 of FIG. 3A is implemented as a laminar phased array 10A having a laminated printed circuit board 16 (i.e., acting as the substrate and also identified by reference number "16") supporting the above noted plurality of elements 18 and integrated circuits 14. The elements 18 preferably are formed as a plurality of square or rectangular patch antennas oriented in a triangular patch array configuration. In other words, each element 18 forms a triangle with two other adjacent elements 18—they are not aligned both in rows and columns. From the perspective of FIG. 3A, the elements 18 are aligned in rows but staggered in the Y direction (i.e., columns). When compared to a rectangular lattice configuration, this triangular lattice configuration requires fewer elements 18 (e.g., about 15 percent fewer in some implementations) for a given grating lobe free scan volume. Other embodiments, however, may use other lattice configurations, such as a pentagonal configuration or a hexagonal configuration. Moreover, despite requiring more elements 18, some embodiments may use a rectangular lattice configuration. Like other similar phased arrays, the printed circuit board 16 also may have a ground plane (not shown) that electrically and magnetically cooperates with the elements 18 to facilitate operation.

Figure 3B:
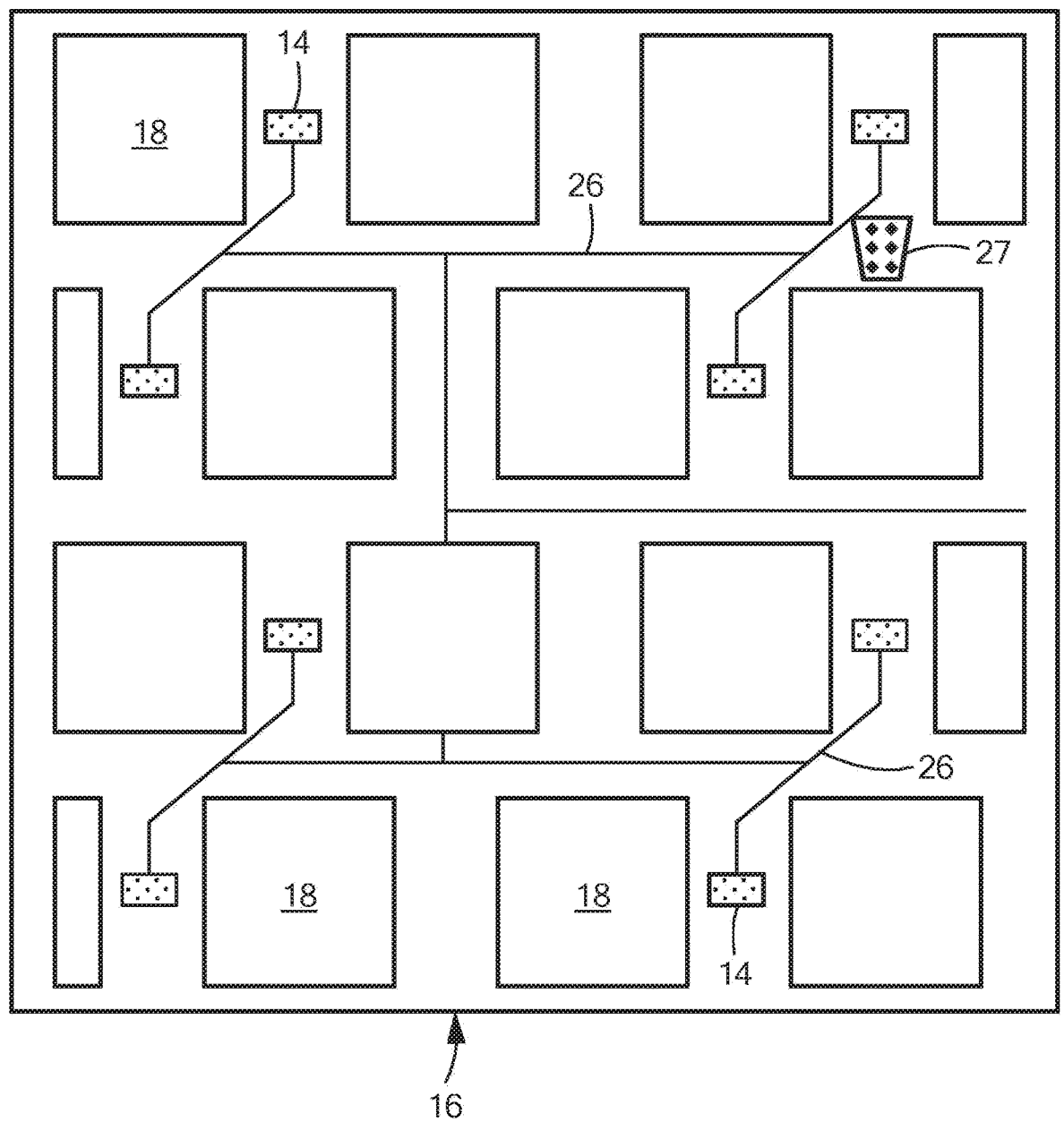
FIG. 3B schematically shows a close-up of a portion of the laminated printed circuit board of FIG. 3A.

Indeed, the array shown in FIGS. 3A and 3B is a small phased array 10A. Those skilled in the art can apply principles of illustrative embodiments to laminar phased arrays 10A with hundreds, or even thousands of elements 18 and integrated circuits 14. In a similar manner, those skilled in the art can apply various embodiments to smaller phased arrays 10A.

Figure 5:
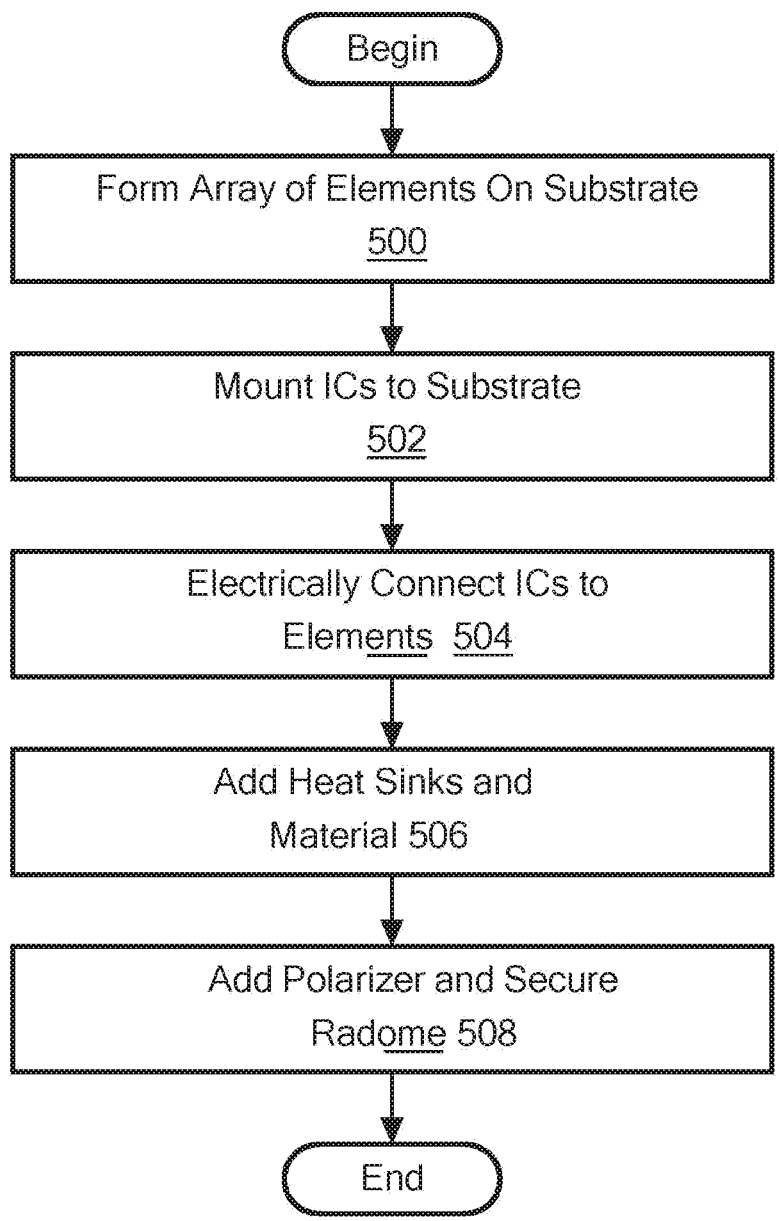
FIG. 5 shows a process of forming an AESA system in accordance with illustrative embodiments of the invention.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. As discussed below with regard to FIG. 5, illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24 at least in part controls the mode and operation of the phased array 10A, as well as other array functions.

The AESA system 10 has a plurality of the above noted integrated circuits 14 (mentioned above with regard to FIG. 2B) for controlling operation of the elements 18. Those skilled in the art often refer to these integrated circuits 14 as "beam steering integrated circuits." In preferred embodiments, these integrated circuits operate at high frequencies—i.e., about 10 GHz and higher (e.g., 10 GHz to 90 GHz, or higher). Such frequencies are referred to herein as "mm-wave" frequencies.

Each integrated circuit 14 preferably is configured with at least the minimum number of functions to accomplish the desired effect. Indeed, integrated circuits 14 for dual mode elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
- phase shifting,
- amplitude controlling/beam weighting,
- switching between transmit mode and receive mode,
- output amplification to amplify output signals to the elements 18,
- input amplification for received RF signals (e.g., signals received from the satellite 12), and
- power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches.

As noted above, the AESA system 10 preferably communicates with one or more orbiting satellites 12 and thus, uses satellite frequencies for that communication. Accordingly, the plurality of integrated circuits 14 preferably are configured operate the phased array 10A at one or more frequencies of the Ka-band, Ku-band, and/or X-band to communicate with at least one satellite 12. Of course, as satellite communication technology progresses, future implementations may modify the frequency bands of the integrated circuits 14 to communicate using new satellite frequencies.

In some embodiments, multiple elements 18 share the integrated circuits 14, thus reducing the required total number of integrated circuits 14. To that end, each integrated circuit 14 preferably operates on at least one element 18 in the array. For example, one integrated circuit 14 can operate on two or four different elements 18. Of course, those skilled in the art can adjust the number of elements 18 sharing an integrated circuit 14 based upon the application. For example, a single integrated circuit 14 can control two elements 18, three elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16.

As noted above, the dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms of the integrated circuit 14. Instead, such embodiments may duplex at the element 18. This process can be performed by isolating one of the elements 18 between transmit and receive by an orthogonal feed connection.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP), or a more traditional package, such as quad flat no-leads package (QFN package). While other types of packaging may suffice, WLCSP techniques are preferred to minimize real estate on the substrate 16.

It should be reiterated that although FIGS. 3A and 3B show the AESA system 10 with some specificity (e.g., the layout of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configuration of the AESA system 10 of FIG. 3A (and other figures) is for convenience only and not intended to limit all embodiments.

Figure 4:
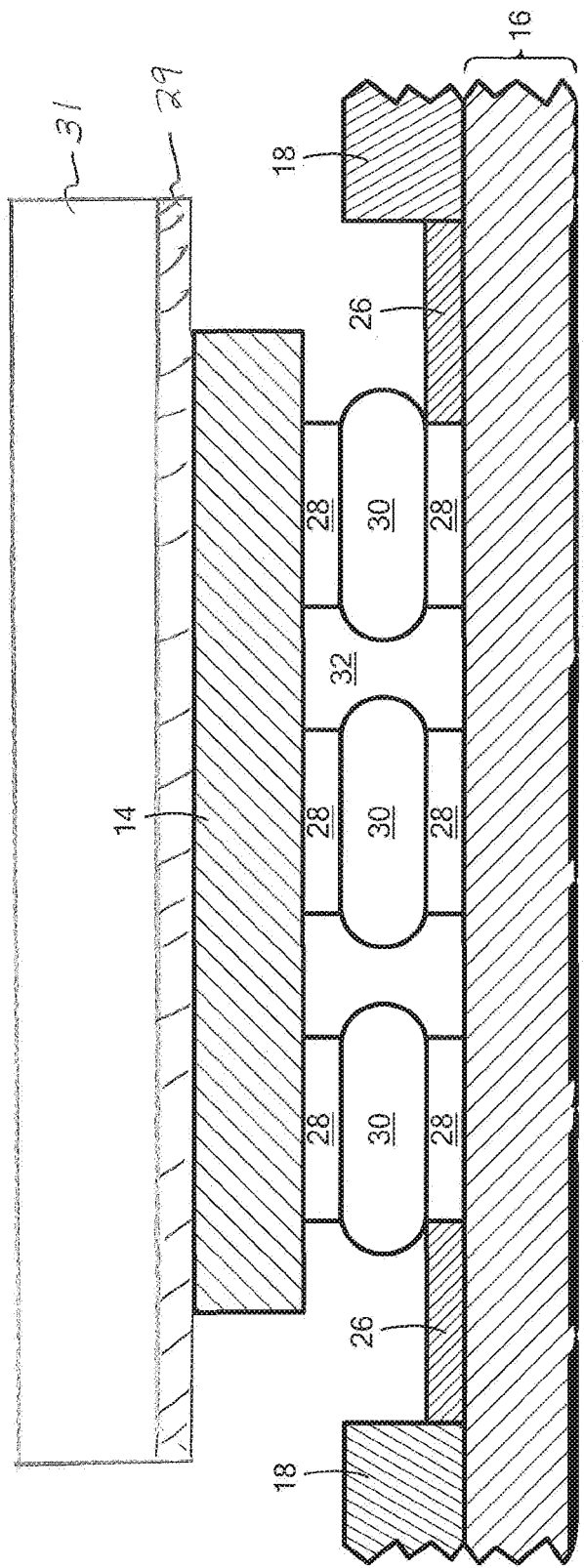
FIG. 4 schematically shows a cross-sectional view of the laminated printed circuit board of 3A to highlight the mounting of its integrated circuits and its heat sink.

FIG. 4 schematically shows a cross-sectional view of the layout of components on the laminated printed circuit board 16 of 3A to highlight the flip-chip mounting of its integrated circuits 14 and its thermal management. The integrated circuit 14 in this drawing intentionally is enlarged to show details of a flip-chip mounting technique. Unlike techniques that permit input/output ("I/O") only on the edge of the integrated circuit 14, flip-chip mounting permits I/O on interior portions of the integrated circuit 14.

As shown, the integrated circuit 14 has a plurality of pads 28 (on one side—its "front side") aligned with a plurality of corresponding pads 28 on the printed circuit board 16. These opposing pads 28 on the integrated circuit 14 and the printed circuit board 16 may be considered to form pairs of pads 28. Solder 30 (e.g., solder balls) electrically connects each the pads in corresponding pairs of pads 28. Interconnect lines, traces, and other electrical interconnects on/in the printed circuit board 16 (e.g., lines 26) thus permit the integrated circuit 14 to communicate with other elements 18 through this electrical interface.

The embodiment shown in FIG. 4 forms a space or void (identified by reference number "32") between the bottom of the integrated circuit 14 (from the perspective of this drawing) and the top surface of the printed circuit board 16. This space 32 may remain an open void—containing no material. Some embodiments may take advantage of this extra space 32 to add further components, such as additional circuit elements, without requiring more circuit board space. Alternatively, this space 32 may contain fill material (not shown) for further stability and thermal management of the integrated circuit 14.

In accordance with illustrative embodiments, a heat sink 31 having its bottom side (from the perspective of FIG. 4) at least partially covered with a thermal interface material 29 is coupled to the back side of the integrated circuit 14. This heat sink 31 and thermal interface material 29 combination may contact just a single integrated circuit 14, or a plurality of integrated circuits 14 across the phased array 10A. More specifically, the heat sink 31 and thermal interface material 29 are in conductive thermal contact with the back side of the integrated circuit 14. Accordingly, heat generated by the integrated circuit 14 conducts through the thermal interface material 29 to the heat sink 31.

The heat sink 31 may be formed from any of a variety of thermally conductive materials, such as metal. The inventors recognized, however, that conductive heat sinks 31 can produce electromagnetic interference (EMI), undesirably reducing isolation and increasing coupling. The inventors further recognized that this increased coupling can interfere with operation of high frequency integrated circuits (e.g., operating at mm-wave frequencies, such as between 10 GHz and 90 GHz), such as the integrated circuit 14 of FIG. 4. This problem becomes particular acute when multiple ports are present. To overcome this problem, the inventors configured the thermal interface material 29 to form an effective mitigation barrier against electromagnetic interference from the heat sink 31, while maintaining its thermal conductive qualities. As such, the thermal interface material 29 preferably substantially mitigates electromagnetic interference caused by the heat sink 31, reducing the strength of the coupling signal.

Those skilled in the art may configure the thermal interface material 29 in any of a variety of manners to act as a sufficient EMI barrier. Indeed, the thermal interface material need not be a perfect barrier and block all EMI. Instead, the thermal interface material 29 may be configured to block at least a specified amount or percentage range of EMI based on the specific application. For example, the thermal interface material 29 may be configured to block at least 90% of the EMI, at least 80% of the EMI, or some other amount and still enable effective operation of the integrated circuit 14. This should improve performance of integrated circuits operating at mm-wave frequencies, such as integrated circuits commonly used for RF communication.

To that end, the thermal interface material 29 may be made from any of a variety of materials to have both satisfactory EMI isolation and thermal conduction properties. In preferred embodiments, the thermal interface material 29 has a prescribed loss value configured to provide the desired EMI isolation. The thermal interface material thus a prescribed loss value sufficient to at least provide partial RF or EM shielding (e.g., attenuating one or both of those interfering signals a prescribed amount, such as at least any of 10%, 20%, 50%, 80%, 90%, 95%), or some attenuation between those values.

For example, that loss value may comprise a specific magnetic loss tangent of the thermal insulating material 29. To that end, among other ways, the thermal isolation material 29 can be formed from a carbon loaded material, such as carbon having ferrite particulates and/or having magnetic attenuating material loading the carbon. Carbon composites may suffice. As another example, the thermal isolation material 29 can be formed from a malleable material, such as 3M™ EMI Absorber AB5050SHF, distributed by 3M Company of Minneapolis, Minn.

In other embodiments, the interface material 29 can mitigate the noted signals by tuning material qualities other than the magnetic loss tangent. For example, the mitigation may be produced as a result of tuning the dielectric loss tangent, the resistive nature of the material, or some combination of two or more of the magnetic loss tangent, dielectric loss tangent, and the resistive nature of the material.

The isolation material 29 can attenuate EMI by having a specified magnetic loss tangent for a given application (e.g., between 0.5 and 4.5), which the inventors believe rapidly attenuates EMI in the desired high-frequency applications. Indeed, other positive magnetic tangents may suffice, such as between a smaller range like 1.0 to 4.0, or other ranges. Discussion of specific ranges is by example only, however, and not necessarily limiting all embodiments. Accordingly, in addition to conducting thermal energy in the desired manner, the thermal isolation material 29 provides EMI shielding/attenuation. Moreover, the thermal isolation material 29 may shield/attenuate radio frequency interference (RMI).

In some embodiments, the thermal interface material 29 covers less than the entire lower surface of the heat sink 31 (e.g., just the area of the back side of the integrated circuit 14). Other embodiments may cover various other areas, or substantially the entire lower surface of the heat sink 31.

Alternative embodiments, however, still may use similar integrated circuits 14, but not use flip-chip mounting techniques. Instead, other mounting techniques may couple the integrated circuits 14 with the substrate 16. Among other things, those techniques may incorporate surface mounting, or wirebond mounting with the integrated circuit 14 rotated 180 degrees from the orientation of FIG. 4. Accordingly, discussion of flip chip mounting techniques is but one of a variety of different techniques that may be used with various embodiments of the invention.

FIG. 5 shows a process of forming the phased array 10A/AESA system 10 in accordance with illustrative embodiments of the invention. It should be noted that this process is substantially simplified from a longer process that normally would be used to form the AESA system 10. Accordingly, the process of forming the AESA system 10 is expected to have many steps, such as testing steps, soldering steps, or passivation steps, which those skilled in the art may use.

In addition, some of the steps may be performed in a different order than that shown, or at the same time. Those skilled in the art therefore can modify the process as appropriate. Moreover, as noted above and below, the discussed materials and structures are merely examples. Those skilled in the art can select the appropriate materials and structures depending upon the application and other constraints. Accordingly, discussion of specific materials and structures is not intended to limit all embodiments.

The process of FIG. 5 begins at step 500, which forms the array of elements 18 on the substrate 16/printed circuit board 16. As noted above, the elements 18 preferably are formed from metal deposited onto the substrate 16 in a triangular lattice. This step also may form pads 28 and transmission lines 26 on the printed circuit board 16 to extend to the elements 18 (from the pads 28). As discussed below, these lines 26 electrically connect the integrated circuits 14 with the elements 18.

In preferred embodiments, the elements 18 are spaced apart from each other as a function of the wavelength of the signals expected to be transmitted and received by the AESA system 10. For example, the distances between the elements 18 may be spaced apart a distance equal to between 40-60 percent of the wavelength of the relevant signals. Some embodiments, however, may vary the spacing of the elements 18.

Those skilled in the art can select the appropriate numbers of elements 18, based upon the application. Specifically, a given application may require a specified minimum equivalent isotropically radiated power ("EIRP") for transmitting signals. In addition, that same application may have a specified minimum G/T for receiving signals. Thus, step 500 may form the array to have a minimum number of elements 18 to meet either or both the EIRP and the G/T requirements of the application. For example, after establishing the feed loss and the noise figure of the receive amplifier 40 of the vector receive arms 36, one in the art can set the array size to a desired G/T. Of course, the phased array 10A may have more elements 18 beyond that minimum number.

Other embodiments may use other requirements for selecting the appropriate number of elements 18. Accordingly, discussion of the specific means for selecting the appropriate number of elements 18, and their spacing, is for descriptive purposes only and not intended to limit various embodiments of the invention.

At step 502, the process mounts the integrated circuits 14 to the printed circuit board 16/substrate 16. To that end, as noted above, when using WLCSP integrated circuits 14, illustrative embodiments may use conventional flip-chip mounting processes. Such a process directly electrically connects the integrated circuits 14 to the elements 18 (step 504). To that end, such embodiments may deposit solder paste (e.g., powdered solder and flux) on the pads 28 of the printed circuit board 16, and position the integrated circuits 14 on their respective board pads 28. Then, the printed circuit board 16 may be heated (e.g., using a reflow oven or process) to physically and electrically couple the pads 28 with the solder 30.

Some embodiments that do not use flip-chip mounted WLCSP integrated circuits 14, however, may require the additional step of step 504 to electrically connect the integrated circuits 14 to the elements 18. For example, a wirebond operation may be required to solder wirebonds between the integrated circuits 14 and the elements 18.

Next, step 506 adds the heat sinks 31 and thermal interface material 29 to the back sides of the integrated circuits 14. In illustrative embodiments, the thermal interface material 29 first is applied to the bottom side of the heat sinks 31, and then secured to the back sides of the integrated circuits 14. Other embodiments, however, may apply the thermal interface material 29 directly to the back sides of the integrated circuits 14 before coupling the heat sinks 31. In yet other embodiments, the thermal interface material 29 is an independent element that is coupled between the heat sink 31 and integrated circuit.

The process concludes by adding the polarizer 20 and securing the radome 22 (step 508) to the apparatus in a conventional manner.

Accordingly, the inventors discovered that specially configured and well positioned thermal interface material 29 enables effective thermal management of high frequency integrated circuits 14 while minimizing electromagnetic interference.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a phased array comprising:
   coupling a plurality of integrated circuits to a laminar substrate having a patch array formed by a plurality of elements, each integrated circuit configured to control receipt and/or transmission of signals by the plurality of elements in the patch array, each integrated circuit being a high frequency integrated circuit operating at mm-wave frequencies;
   providing thermal interface material having a prescribed magnetic loss tangent value sufficient to at least provide at least partial RF or EM shielding; and
   coupling a plurality of heat sinks to the plurality of integrated circuits, at least one of the integrated circuits being in conductive thermal contact with the thermal interface material and at least one of the heat sinks ("given heat sink(s)"), the thermal interface material being between the at least one integrated circuit and the given heat sink(s).

2. The method of claim 1 wherein the thermal interface material has a magnetic loss tangent value of between 0.5 and 4.5.

3. The method of claim 1 the mm wavelength frequencies is between 10 GHz and 80 GHz.

4. The method of claim 1 wherein the thermal interface material comprises carbon or a carbon composite.

5. The method of claim 4 wherein coupling the plurality of integrated circuits comprises flip-chip coupling the plurality of integrated circuits to the path array, the patch array comprising a laminar substrate.

6. The method of claim 1 further comprising forming a plurality of transmission lines on the laminar substrate to physically couple each integrated circuit with the one corresponding element by at least one of the plurality of transmission lines.

7. The method of claim 1 wherein the plurality of elements form a triangular lattice.

8. The method of claim 1 wherein coupling a plurality of integrated circuits comprises flip-chip coupling the plurality of integrated circuits to the laminar substrate.

9. The method of claim 1 wherein the thermal interface material is malleable.

10. The method of claim 1 wherein the thermal interface material contacts at least two integrated circuits.

11. A method of forming a patch array with a plurality of elements and a plurality of integrated circuits configured to control receipt and/or transmission of signals by the plurality of elements in the patch array, each integrated circuit being a high frequency integrated circuit operating at mm-wave frequencies, the method comprising:
    providing a heat sink having an exterior surface; and
    covering at least a portion of the exterior surface of the heat sink with a thermal interface material having a prescribed magnetic loss tangent value sufficient to at least provide at least partial RF or EM shielding.

12. The method of claim 11 further comprising coupling the heat sink to at least one of the plurality of integrated circuits, the at least one integrated circuit being in conductive thermal contact with the thermal interface material and the heat sink, the thermal interface material being between the at least one integrated circuit and the at least one heat sink.

13. The method of claim 11 wherein covering at least a portion of the exterior surface comprises covering the entire exterior surface with the thermal interface material.

14. The method of claim 11 further comprising coupling the plurality of integrated circuits to the patch array formed by the plurality of elements.

15. The method of claim 11 wherein the thermal interface material has a magnetic loss tangent value of between 0.5 and 4.5.

16. The method of claim 11 the mm wavelength frequencies is between 10 GHz and 80 GHz.

17. The method of claim 11 wherein the thermal interface material comprises carbon or a carbon composite.

18. The method of claim 11 further comprising forming a plurality of transmission lines on the laminar substrate to physically couple each integrated circuit with at least one corresponding element by at least one of the plurality of transmission lines.

19. The method of claim 11 wherein the plurality of elements forms a triangular lattice.

20. The product produced by the process of claim 11.

\* \* \* \* \*